(12) United States Patent
Kum et al.

(10) Patent No.: US 9,570,696 B2
(45) Date of Patent: Feb. 14, 2017

(54) WHITE ORGANIC LIGHT EMITTING DEVICE

(71) Applicant: LG DISPLAY CO., LTD., Seoul (KR)

(72) Inventors: Taeil Kum, Paju-si (KR); Gwijeong Cho, Dalseong-gun (KR); KiWoog Song, Goyang-si (KR); Taeshick Kim, Yongin-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 14/710,154

(22) Filed: May 12, 2015

(65) Prior Publication Data
US 2015/0372250 A1 Dec. 24, 2015

(30) Foreign Application Priority Data
Jun. 23, 2014 (KR) .................. 10-2014-0076686

(51) Int. Cl.
*H01L 51/50* (2006.01)
*H01L 51/52* (2006.01)
*H01L 51/00* (2006.01)

(52) U.S. Cl.
CPC ......... *H01L 51/504* (2013.01); *H01L 51/5044* (2013.01); *H01L 51/5278* (2013.01); *H01L 51/002* (2013.01); *H01L 2251/558* (2013.01)

(58) Field of Classification Search
CPC .............. H01L 51/504; H01L 51/5278; H01L 51/5044; H01L 2251/558; H01L 51/002
See application file for complete search history.

(56) References Cited

U.S. PATENT DOCUMENTS

| | | | |
|---|---|---|---|
| 2006/0290270 A1* | 12/2006 | Kim ................. | H05B 33/26 313/503 |
| 2007/0046189 A1 | 3/2007 | Hatwar et al. | |
| 2009/0191428 A1* | 7/2009 | Hatwar ............. | H01L 51/0077 428/690 |
| 2013/0146850 A1 | 6/2013 | Pieh et al. | |
| 2014/0014933 A1* | 1/2014 | Sasaki ............. | H01L 51/5044 257/40 |
| 2014/0117337 A1 | 5/2014 | Jung et al. | |
| 2015/0155513 A1 | 6/2015 | Pieh et al. | |

FOREIGN PATENT DOCUMENTS

| | | |
|---|---|---|
| CN | 101960632 A | 1/2011 |
| CN | 103165817 A | 6/2013 |
| CN | 103794730 A | 5/2014 |
| CN | 104752473 A | 7/2015 |
| CN | 104581729 A | 4/2016 |
| EP | 2 889 929 A1 | 7/2015 |

* cited by examiner

*Primary Examiner* — Kyoung Lee
(74) *Attorney, Agent, or Firm* — Dentons US LLP

(57) ABSTRACT

Provided is a white organic light emitting device which can improve abnormal light emission and efficiency and reliability of the device.
A white organic light emitting device according to an exemplary embodiment of the present invention includes: a first light emitting unit including a first emitting layer between a first electrode and a second electrode; a second light emitting unit including a second emitting layer on the first light emitting unit; and a charge generation layer between the first light emitting unit and the second light emitting unit, and a volume of a metal in the charge generation layer is 1.0% or less of the total volume of the charge generation layer.

25 Claims, 4 Drawing Sheets

FIG. 2

WHITE ORGANIC LIGHT EMITTING DEVICE

CROSS-REFERENCE TO RELATED APPLICATIONS

This application claims the priority of Korean Patent Application No. 2014-0076686 filed on Jun. 23, 2014, in the Korean Intellectual Property Office, the disclosure of which is incorporated herein by reference.

BACKGROUND OF THE INVENTION

Field of the Invention

The present invention relates to an organic light emitting device, and more particularly, to a white organic light emitting device which can improve abnormal light emission.

Description of the Related Art

In recent years, as the world entered the information age, the field of display devices for visually displaying electrical information signals has developed rapidly. Thus, various flat panel display devices have developed in the areas of, such as thinning, weight lightening, and consuming low power.

Specific examples of the flat panel display devices include a Liquid Crystal Display (LCD) device, a Plasma Display Panel (PDP) device, a Field Emission Display (FED) device, and an Organic Light Emitting Display (OLED) device.

In particular, the OLED device is a self-light emitting device that has a high response time, a high emission efficiency, a high luminance, and a wide viewing angle as compared with the other flat panel display devices.

An organic light emitting device includes an organic emitting layer between two electrodes. An electron and a hole are injected into the organic emitting layer from the two electrodes and an exciton is formed by combining the electron and hole. Further, the organic light emitting device uses a principle in which a light is emitted when the exciton makes transitions from an excited state to a ground state.

The OLED device does not need a separate light source unlike a liquid crystal display (LCD) device, and, thus, the OLED device can be manufactured into a lightweight and thin form. Further, the OLED device is advantageous in terms of power consumption since it is driven with a low voltage. Also, the OLED device has excellent color expression ability, a high response time, a wide viewing angle, and a high contrast ratio (CR). Therefore, the OLED device is regarded as a next-generation display device.

As high-resolution display devices develop, the demand for higher number of pixels per unit area and a higher luminance has been increased. However, in a light emitting structure of the OLED device, there is a limitation in luminance per unit area. Also, an increase in driving voltage causes a decrease in the reliability of an organic light emitting device and an increase in power consumption.

Accordingly, it is necessary to overcome the limitations in emission efficiency and lifespan of an organic light emitting device that hinder a quality and productivity of the OLED device. Thus, various studies for developing an organic light emitting device capable of improving emission efficiency and a lifespan have been conducted.

SUMMARY OF THE INVENTION

A conventional organic light emitting device has limitations in emission property and lifespan due to a material of an organic emitting layer and a structure of the device. Thus, various methods for improving efficiency in a white organic light emitting device have been suggested.

According to one of the methods, two light emitting units are provided in an organic light emitting device to improve efficiency. The light emitting unit may include a hole transporting layer (HTL), an emitting layer (EML), and an electron transporting layer (ETL).

A charge generation layer (CGL) is provided between the two light emitting units in order to generate and transfer a charge. The CGL may be formed of p-type or n-type. A hole and an electron are generated at an interface between a p-type CGL (P-CGL) and the HTL. The generated electron is transferred to an n-type CGL (N-CGL) including an alkali metal by pumping. A content of an alkali metal or alkali earth metal in the N-CGL is essential for transferring the electron and it affects a lifespan and a voltage of the organic light emitting device. If the content of an alkali metal or alkali earth metal is lower than a predetermined level, an organic light emitting display device cannot emit normal white light and a voltage is increased.

If the content of an alkali metal or alkali earth metal is equal to or higher than the predetermined level, a voltage is increased and abnormal light emission occurs when the organic light emitting device is manufactured. That is, the organic light emitting device includes red, green, and blue sub-pixels. There occurs a light leakage which occurs when an electric field is applied to a red sub-pixel, and a part of an adjacent green sub-pixel may emit an undesired light. Or when an electric field is applied to a blue sub-pixel, a part of an adjacent green sub-pixel may emit an undesired light.

Thus, the inventors of the present invention recognized the above-described problems, and conducted various experiments for improving efficiency and reliability of a device by adjusting a content of an alkali metal or alkali earth metal in a charge generation layer. Therefore, the inventors of the present invention invented a white organic light emitting device having a new structure capable of improving efficiency and reliability of a device through various experiments.

An object of the present invention is to provide a white organic light emitting device which can prevent abnormal light emission of the device, minimize a driving voltage. Also, an object is to improve efficiency and reliability of the device by adjusting a content of a metal in a charge generation layer to be equal to or lower than a predetermined level.

According to an aspect of the present invention, there is provided a white organic light emitting device including: a first light emitting unit between a first electrode and a second electrode; and a second light emitting unit on the first light emitting unit. In an exemplary embodiment of the present invention, a charge generation layer is between the first light emitting unit and the second light emitting unit. A metal in the charge generation layer is within a range of 1.00 or less of the total volume of the charge generation layer, so that the white organic light emitting device capable of preventing abnormal light emission of the device, reducing a driving voltage, increasing a lifespan, and improving efficiency and reliability of the device can be provided.

The metal is within a range of 0.3% to 1.0% of the total volume of the charge generation layer.

The metal is one of lithium (Li), sodium (Na), potassium (K), cesium (Cs), magnesium (Mg), strontium (Sr), barium (Ba), and radium (Ra), or a combination thereof.

The metal has a work function in the range of 2.2 to 4.1 eV.

The charge generation layer is an N-type charge generation layer.

The charge generation layer further includes a P-type charge generation layer.

The first emitting layer is a blue emitting layer, and the second emitting layer is a yellow-green emitting layer.

According to another aspect of the present invention, there is provided a white organic light emitting device including: a first light emitting unit between a first electrode and a second electrode; a second light emitting unit on the first light emitting unit; and a third light emitting unit on the second light emitting unit. In another exemplary embodiment of the present invention, a first charge generation layer is between the first light emitting unit and the second light emitting unit, and a second charge generation layer is between the second light emitting unit and the third light emitting unit. A metal in the first charge generation layer and the second charge generation layer is within a range of 0.8% or less of the total volume of the first charge generation layer and the second charge generation layer, so that the white organic light emitting device capable of preventing abnormal light emission of the device, reducing a driving voltage, increasing a lifespan, and improving efficiency and reliability of the device can be provided.

The metal is within a range of 0.6% to 0.8% of the total volume of the first charge generation layer and the second charge generation layer.

The metal is one of lithium (Li), sodium (Na), potassium (K), cesium (Cs), magnesium (Mg), strontium (Sr), barium (Ba), and radium (Ra), or a combination thereof.

The metal has a work function in the range of 2.2 to 4.1 eV.

The first charge generation layer and the second charge generation layer include N-type charge generation layers.

The first charge generation layer and the second charge generation layer further include P-type charge generation layers.

The first emitting layer is a blue emitting layer, the second emitting layer is a yellow-green emitting layer, and the third emitting layer is a blue emitting layer.

A white organic light emitting device according to an exemplary embodiment of the present invention includes: a first light emitting unit between a first electrode and a second electrode; and a second light emitting unit on the first light emitting unit. In the exemplary embodiment of the present invention, there is provided the white organic light emitting device that includes a charge generation layer between the first light emitting unit and the second light emitting unit. The white organic emitting device can prevent abnormal light emission of the device, reduce a driving voltage, and improve a lifespan by adjusting a volume of a metal in the first charge generation layer to 1.0% or less of the total volume of the first charge generation layer in consideration of abnormal light emission, a driving voltage, or a lifespan.

The volume of the metal is within a range of 0.3% to 1.0% of the total volume of the first charge generation layer.

In the white organic light emitting device in which the volume of the metal in the first charge generation layer is within a range of 0.3% to 1.0% of the total volume of the first charge generation layer. Abnormal light emission does not occur as compared with the white organic light emitting device in which the volume of the metal in the first charge generation layer is more than 1.0% of the total volume of the first charge generation layer.

In the white organic light emitting device in which the volume of the metal in the first charge generation layer is within a range of 0.3% to 1.0% of the total volume of the first charge generation layer, a driving voltage is reduced as compared with the white organic light emitting device in which the volume of the metal in the first charge generation layer is more than 1.0% of the total volume of the first charge generation layer.

In the white organic light emitting device in which the volume of the metal in the first charge generation layer is within a range of 0.3% to 1.0% of the total volume of the first charge generation layer. Lifespan increases as compared with the white organic light emitting device in which the volume of the metal in the first charge generation layer is more than 1.0% of the total volume of the first charge generation layer.

The first charge generation layer is an N-type charge generation layer, and the metal is in the N-type charge generation layer.

The metal is one of lithium (Li), sodium (Na), potassium (K), cesium (Cs), magnesium (Mg), strontium (Sr), barium (Ba), and radium (Ra), or a combination thereof.

The metal has a work function in the range of 2.2 to 4.1 eV.

The N-type charge generation layer has a thickness of 100 Å to 300 Å so as to reduce the driving voltage and increase the lifespan.

The first charge generation layer further includes a P-type charge generation layer.

The P-type charge generation layer has a thickness of 50 Å to 200 Å so as to reduce the driving voltage and increase the lifespan.

A third light emitting unit on the second light emitting unit and a second charge generation layer is between the second light emitting unit and the third light emitting unitare further included. Also, the total volume of the metal in the first charge generation layer and the second charge generation layer is 0.8% or less of the total volume of the first charge generation layer and the second charge generation layer in consideration of abnormal light emission, a driving voltage, or a lifespan.

The volume of the metal is within a range of 0.6% to 0.8% of the total volume of the first charge generation layer and the second charge generation layer.

In the white organic light emitting device in which the total volume of the metal in the first charge generation layer and the second charge generation layer is within a range of 0.6% to 0.8%, abnormal light emission does not occur as compared with the white organic light emitting device in which the total volume of the metal in the first charge generation layer and the second charge generation layer is 1.0% or more.

In the white organic light emitting device in which the total volume of the metal in the first charge generation layer and the second charge generation layer is within a range of 0.6% to 0.8%, a driving voltage is reduced as compared with the white organic light emitting device in which the total volume of the metal in the first charge generation layer and the second charge generation layer is 1.0% or more.

In the white organic light emitting device in which the total volume of the metal in the first charge generation layer and the second charge generation layer is within a range of 0.6% to 0.8%, a lifespan is increased as compared with the white organic light emitting device in which the total volume of the metal in the first charge generation layer and the second charge generation layer is 1.0% or more.

The first charge generation layer and the second charge generation layer are N-type charge generation layers, and the metal is included in the N-type charge generation layers.

The metal is one of lithium (Li), sodium (Na), potassium (K), cesium (Cs), magnesium (Mg), strontium (Sr), barium (Ba), and radium (Ra), or a combination thereof.

The metal has a work function in the range of 2.2 to 4.1 eV.

The N-type charge generation layer has a thickness of 100 Å to 300 Å so as to reduce the driving voltage and increase the lifespan.

The first charge generation layer and the second charge generation layer further include P-type charge generation layers.

The P-type charge generation layer has a thickness of 50 Å to 200 Å so as to reduce the driving voltage and increase the lifespan.

A white organic light emitting device according to an exemplary embodiment of the present invention includes: a first light emitting unit between a first electrode and a second electrode; and a second light emitting unit on the first light emitting unit. In the exemplary embodiment of the present invention, there is provided the white organic light emitting device that includes a first charge generation layer between the first light emitting unit and the second light emitting unit. Also, the white organic light emitting device can prevent abnormal light emission of the device, reduce a driving voltage, and improve lifespan by setting a work function of a metal included in the first charge generation layer to 2.2 to 4.1 eV in consideration of abnormal light emission, a driving voltage, or a lifespan.

In the white organic light emitting device, the volume of the metal is 1.0% or less of the total volume of the first charge generation layer.

The volume of the metal is within a range of 0.3% to 1.0% of the total volume of the charge generation layer.

The first charge generation layer includes an N-type charge generation layer, and the metal is in the N-type charge generation layer.

The metal is one of lithium (Li), sodium (Na), potassium (K), cesium (Cs), magnesium (Mg), strontium (Sr), barium (Ba), and radium (Ra), or a combination thereof.

A third light emitting unit on the second light emitting unit and a second charge generation layer is positioned between the second light emitting unit and the third light emitting unit are further included. Also, the total volume of the metal included in the first charge generation layer and the second charge generation layer is 0.8% or less of the total volume of the first charge generation layer and the second charge generation layer in consideration of abnormal light emission, a driving voltage, or a lifespan.

The volume of the metal is in the range of 0.6% to 0.8% of the total volume of the first charge generation layer and the second charge generation layer. The first charge generation layer and the second charge generation layer include N-type charge generation layers, and the metal is in the N-type charge generation layers.

Details of other exemplary embodiments will be included in the detailed description of the invention and the accompanying drawings.

According to an exemplary embodiment of the present invention, there is an effect of preventing abnormal light emission of a device by adjusting a metal in a charge generation layer to a predetermined level.

Further, there is an effect of increasing a lifespan of a device by adjusting a metal in a charge generation layer to a predetermined level.

Furthermore, there is an effect of reducing a driving voltage of a device by adjusting a metal in a charge generation layer to a predetermined level.

Moreover, there is an effect of improving efficiency and reliability of a device.

The effects of the present invention are not limited to the aforementioned effects, and other effects, which are not mentioned above, will be apparent to a person having ordinary skill in the art from the following description.

The objects to be achieved by the invention, the means for achieving the objects, and effects of the invention described above do not specify essential features of the claims, and, thus, the scope of the claims is not limited to the disclosure of the invention.

BRIEF DESCRIPTION OF THE DRAWINGS

The above and other aspects, features and other advantages of the present invention will be more clearly understood from the following detailed description taken in conjunction with the accompanying drawings, in which:

FIG. 2 is a diagram illustrating an experimental result of the white organic light emitting device according to an exemplary embodiment of the present invention;

DETAILED DESCRIPTION OF THE PREFERRED EMBODIMENT

Figure 1:
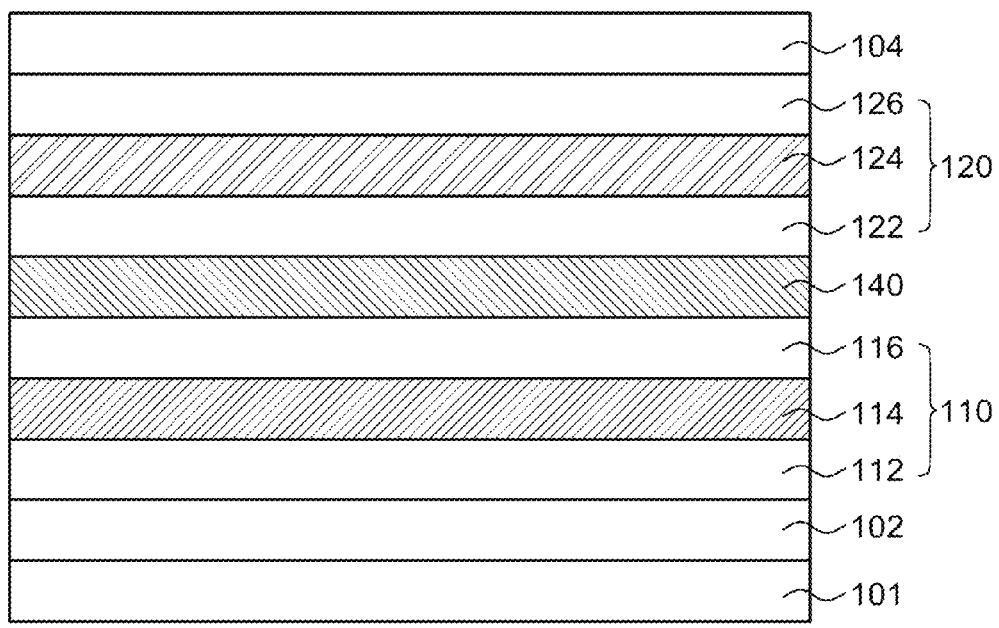
FIG. 1 is a schematic cross-sectional view illustrating a white organic light emitting device according to an exemplary embodiment of the present invention.

Advantages and features of the present invention, and methods for accomplishing the same will be more clearly understood from exemplary embodiments described below with reference to the accompanying drawings. However, the present invention is not limited to the following exemplary embodiments but may be implemented in various different forms. The exemplary embodiments are provided only to complete disclosure of the present invention and to fully provide a person having ordinary skill in the art to which the present invention pertains with the category of the invention, and the present invention will be defined by the appended claims.

The shapes, sizes, ratios, angles, numbers, and the like illustrated in the accompanying drawings for describing the exemplary embodiments of the present invention are merely examples, and the present invention is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the relation in order of time is described using the terms such as "after", "subsequent to", "next to", and "before", discontinuous relations may be included unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present invention.

The features of various embodiments of the present invention can be partially or entirely bonded to or combined with each other and can be interlocked and operated in technically various ways as can be fully understood by a person having ordinary skill in the art, and the embodiments can be carried out independently of or in association with each other.

Hereinafter, exemplary embodiments of the present invention will be described in detail with reference to the accompanying drawings.

FIG. 1 is a diagram illustrating a white organic light emitting device according to an exemplary embodiment of the present invention.

A white organic light emitting device 100 illustrated in FIG. 1 includes a substrate 101, a first electrode 102, a second electrode 104, and a first light emitting unit 110 and a second light emitting unit 120 between the first and second electrodes 102 and 104.

The first electrode 102 is an anode for supplying a hole and may be formed of a transparent conductive material such as TCO (Transparent Conductive Oxide) including ITO (Indium Tin Oxide), IZO (Indium Zinc Oxide), and the like, but is not necessarily limited thereto.

The second electrode 104 is a cathode for supplying an electron and may be formed of a metallic material such as gold (Au), silver (Ag), aluminum (Al), molybdenum (Mo), magnesium (Mg), and the like or an alloy thereof, but is not necessarily limited thereto.

The first electrode 102 and the second electrode 104 may be referred to as an anode and a cathode, respectively.

The first electrode 102 may be a transmissive electrode, and the second electrode 104 may be a reflective electrode. Otherwise, the first electrode 102 may be a reflective electrode, and the second electrode 104 may be a semi-transmissive electrode.

The first light emitting unit 110 may include a first hole transporting layer (HTL) 112, a first emitting layer (EML) 114, and a first electron transporting layer (ETL) 116 on the first electrode 102.

Although not illustrated in the drawing, a hole injecting layer (HIL) may be further included in the first light emitting unit 110. The HIL is formed on the first electrode 102 and facilitates injection of holes from the first electrode 102. The first HTL 112 supplies holes from the HIL to the first EML 114. The first ETL 116 supplies electrons from a first charge generation layer (CGL) 140 to the first EML 114.

The HIL may be formed of MTDATA (4,4',4"-tris(3-methylphenylphenylamino)triphenylamine), CuPc (copper phthalocyanine), PEDOT/PSS (poly(3,4-ethylenedioxythiphene, polystyrene sulfonate), or the like, but is not necessarily limited thereto.

In the first EML 114, the holes supplied through the first HIL 112 and the electrons supplied through the ETL 116 are recombined, and, thus, light is generated.

The first HTL 112 may be formed by applying two or more layers or two or more materials.

The first ETL 116 may be formed by applying two or more layers or two or more materials.

The first EML 114 includes a blue emitting layer or a red-blue emitting layer. The peak wavelength of a light emitting area of the blue emitting layer may be within a range of 440 nm to 480 nm.

The first CGL 140 is formed between the first light emitting unit 110 and the second light emitting unit 120. The first CGL 140 adjusts a balance of charges between the first light emitting unit 110 and the second light emitting unit 120. The first CGL 140 may include an N-type charge generation layer (N-CGL) and a P-type charge generation layer (P-CGL). The N-CGL is configured to inject electrons to the first light emitting unit 110, and the P-CGL is configured to inject holes into the second light emitting unit 120.

If a metal doping in the N-CGL has a too high or low work function, a gap state between the N-CGL and the metal is not properly formed. Thus, it becomes difficult to transfer electrons. Therefore, a doping metal having a too high or low work function may cause an increase in a driving voltage or a decrease in lifespan.

Therefore, in consideration of abnormal light emission, a driving voltage, or a lifespan, a work function of the metal in the charge generation layer may be within the range of 2.2 to 4.1 eV. That is, the metal doping in the N-CGL as the charge generation layer may be at least one of alkali metals or alkali earth metals having a work function within the range of 2.2 to 4.1 eV. For example, the N-CGL may be formed of an organic layer doped with an alkali metal such as lithium (Li), sodium (Na), potassium (K), or cesium (Cs), or an alkali earth metal such as magnesium (Mg), strontium (Sr), barium (Ba), or radium (Ra), or a combination thereof. However, it is not necessarily limited thereto.

The P-CGL may be formed of an organic layer including a P-type dopant or an inorganic material or a combination thereof, but is not necessarily limited thereto.

An inorganic dopant in the P-CGL may include at least one of, for example, magnesium fluoride ($MgF_2$), magnesium chloride ($MgCl_2$), and zinc fluoride ($ZnF_2$), but is not necessarily limited thereto.

The P-CGL and the N-CGL may be formed of the same material, but are not necessarily limited thereto. If the P-CGL and the N-CGL may be formed of the same material, an interface between the P-CGL and the N-CGL can be removed, and, thus, a lifespan of the device can be increased.

Further, the P-CGL and the N-CGL may be formed of different materials, but are not necessarily limited thereto. If the P-CGL and the N-CGL may be formed of different materials, there may be an advantage in transmission efficiency in transferring or shifting a carrier for an electron or a hole.

Further, the first CGL 140 may be formed of a single layer.

The second light emitting unit 120 may include a second hole transporting layer (HTL) 122, a second emitting layer (EML) 124, and a second electron transporting layer (ETL) 126. Although not illustrated in the drawing, an electron injecting layer (EIL) may be further provided on the second ETL 126 in the second light emitting unit 120. Further, the second light emitting unit 120 may further include a hole injecting layer (HIL).

The second HTL 122 may be formed of the same material as the first HTL 112, but is not necessarily limited thereto.

The second HTL 122 may be formed by applying two or more layers or two or more materials.

The second ETL 126 may be formed of the same material as the first ETL 116, but is not necessarily limited thereto.

The second ETL 126 may be formed by applying two or more layers or two or more materials.

The second emitting layer (EML) 124 of the second light emitting unit 120 is formed of a yellow-green emitting layer The peak wavelength of a light emitting area of the yellow-green emitting later may within a range of 510 nm to 580 nm.

The white organic light emitting device according to an exemplary embodiment of the present invention is a bottom-emission type, but it can be applied to a top-emission type or dual-emission type.

Further, in an organic light emitting display device including the organic light emitting device according to an exemplary embodiment of the present invention, gate lines and data lines configured to define respective pixel areas cross each other on a substrate. Also a power supply line is extended in parallel with any one of them, and a switching thin film transistor connected with the gate line and the data line and a driving thin film transistor connected with the switching thin film transistor are disposed in each pixel area. The driving thin film transistor is connected with the first electrode 102.

In the white organic light emitting device according to an exemplary embodiment of the present invention, a content of an alkali metal or alkali earth metal in the N-CGL of the first CGL 140 is adjusted.

A content of an alkali metal or alkali earth metal in the N-CGL is not randomly set, but it needs to be set in consideration of a structure or a characteristic of the device. That is, the content of an alkali metal or alkali earth metal needs to be adjusted so as to be capable of adjusting abnormal light emission without affecting performance of the device. As described above, if the content of an alkali metal or alkali earth metal in the N-CGL is lower than a predetermined level, normal white light cannot be emitted and a driving voltage may be increased.

And, if the content of an alkali metal or alkali earth metal in the N-CGL is equal to or higher than the predetermined level, a driving voltage may be increased. Then, abnormal light emission may occur when the organic light emitting device is manufactured. Such abnormal light emission causes a leakage in which adjacent pixels are simultaneously turned on when the white organic light emitting device is turned on. Further, the N-CGL has a higher conductivity than the P-CGL, and, thus, a leakage more often occurs in the N-CGL.

Since abnormal light emission occurs and a driving voltage is increased due to a content of a metal in the N-CGL, the inventors of the present invention conducted experiments for evaluating abnormal light emission and measuring a driving voltage and lifespan in order to adjust the metal content. Results of the experiments are as illustrated in FIG. 2 and listed in Table 1.

Figure 2:
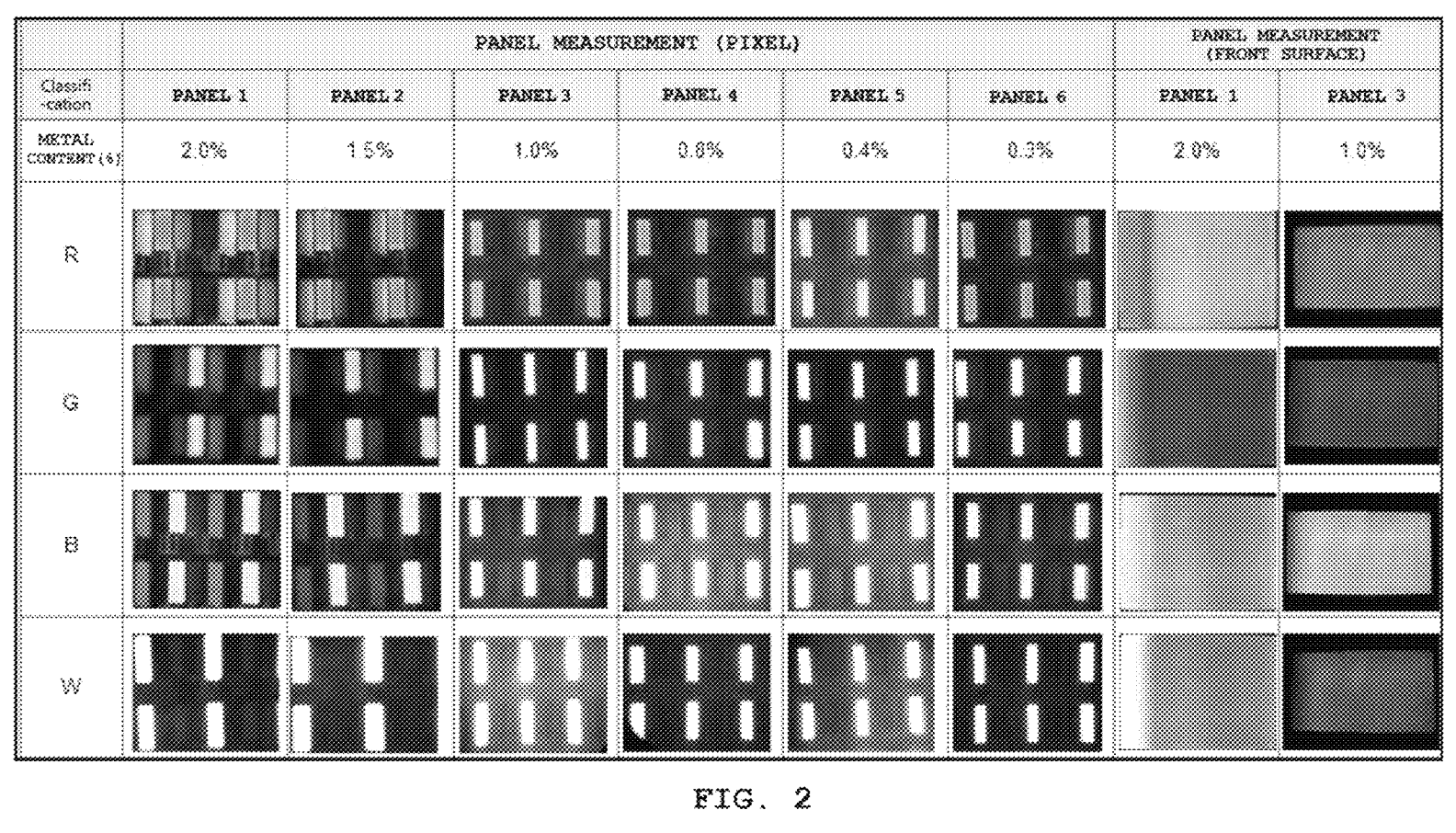

As illustrated in FIG. 2, there were six panels for experiment, and abnormal light emission of the panels was evaluated. The organic light emitting device illustrated in FIG. 1 was applied to the six panels. Further, abnormal emission of red, green, blue, and white lights was measured.

In this experiment, abnormal light emission was measured with the N-CGL having a thickness of 200 Å, but the thickness is not limited thereto.

A driving voltage is affected by the thickness of the N-CGL and the content of a metal included in the N-CGL. Therefore, if the thickness of the N-CGL is within a range of 100 Å to 300 Å, the device may obtain a desired characteristic such as a reduced driving voltage or an increased lifespan. That is, the thickness of the N-CGL may be in the range of 100 Å to 300 Å in order to reduce a driving voltage and increase a lifespan. Further, if the thickness of the P-CGL is within a range of 50 Å to 200 Å, the device may obtain a desired characteristic such as a reduced driving voltage or an increased lifespan. That is, the thickness of the P-CGL may be within the range of 50 Å to 200 Å in order to reduce a driving voltage and increase lifespan. In FIG. 2, a content of an alkali metal or alkali earth metal in the N-CGL of the first CGL 140 is referred to as a metal content. A panel 1 is formed by setting a content of an alkali metal or alkali earth metal in the N-CGL of the first CGL 140 to 2.0% of the total volume of the charge generation layer. A panel 2 is formed by setting the content to 1.5%, and a panel 3 is formed by setting the content to 1.0%. A panel 4 is formed by setting the content to 0.8%, a panel 5 is formed by setting the content to 0.4%, and a panel 6 is formed by setting the content to 0.3%.

According to the results of measurement from the panel 1 to panel 6, it can be seen that in the panel 3 to panel 6 in which the content of an alkali metal or alkali earth metal is lower than 1.0%, abnormal light emission does not occur.

Further, according to the results of measurement from front surfaces of the panels, it can be seen that in the panel 3 with the content of 1.0%, abnormal light emission does not occur as compared with the panel 1 with the content of 2.0%.

Therefore, it can be seen that if the content of a metal included in the N-CGL is adjusted to 1.0% or less of the total volume of the N-CGL, abnormal light emission does not occur. That is, it can be seen that if the content of a metal included in the N-CGL is set in the range of 0.3% to 1.0% of the total volume of N-CGL, abnormal light emission does not occur.

The results of measurement on a driving voltage and lifespan from the panel 1 to panel 6 are as listed in Table 1 below. A driving voltage was measured at a current density of 10 mA/cm$^2$.

TABLE 1

| Classification | Panel 1 | Panel 2 | Panel 3 | Panel 4 | Panel 5 | Panel 6 |
| --- | --- | --- | --- | --- | --- | --- |
| Voltage (10 mA/cm$^2$) | 8.7 | 8.1 | 8.1 | 7.5 | 7.8 | 9.0 |
| Lifespan (%) | 85 | 86 | 100 | 97 | 90 | 85 |

As listed in Table 1, it can be seen that as a content of a metal in the N-CGL increases, a driving voltage increases. Meanwhile, it can be seen that in the panel 3 to the panel 5 having a metal content of 1.0% or less, a driving voltage is low.

Further, it can be seen that in the panel 6 having a metal content of 0.3% in the N-CGL, a driving voltage is high. Therefore, it can be seen that a driving voltage cannot be lowered by reducing a content of a metal included in the N-CGL. If a content of a metal in the N-CGL is set to 0.3%, abnormal light emission does not occur. Therefore, it can also be applied to a device.

Further, in terms of lifespan, it can be seen that lifespan of the panel 3 to the panel 6 having a metal content of 1.0% or less in the N-CGL are from 85% to 100%. Meanwhile, it can be seen that the panel 1 having a metal content of 2.0% and the panel 2 having a metal content of 1.5% have a shorter lifespan.

Therefore, since it is possible to adjust a content of a metal in the N-CGL depending on a desired characteristic of a device, it is possible to set the content of a metal in the N-CGL within a range of 0.3% to 1.0% in consideration of improvement of abnormal light emission and characteristics such as a driving voltage or lifespan.

According to the above-described experimental results, it can be seen that if a metal content in an N-CGL of an organic light emitting device including two light emitting units is adjust to 1.0% or less of the total volume of the N-CGL, it is possible to prevent abnormal light emission of the device. There is an advantage in a driving voltage or lifespan of the device.

That is, it can be seen that when a content of a metal included in the N-CGL is within the range of 0.3% to 1.0% of the total volume of the N-CGL, it is possible to prevent abnormal light emission of the device. There is an advantage in a driving voltage or a lifespan of the device.

As described above, it can be seen that if the volume of the metal in the first CGL is within the range of 0.3% to 1.0% of the total volume of the N-CGL, abnormal light emission does not occur as compared with a case where the volume of the metal in the first CGL is more than 1.0%. Further, it can be seen that if the volume of the metal included in the first CGL is within the range of 0.3% to 1.0% of the total volume of the N-CGL, a driving voltage is reduced as compared with a case where the volume of the metal included in the first CGL is more than 1.0%. Furthermore, it can be seen that if the volume of the metal in the first CGL is within the range of 0.3% to 1.0% of the total volume of the N-CGL, lifespan is increased as compared with a case where the volume of the metal included in the first CGL is more than 1.0%. Therefore, by adjusting a content of a metal in the N-CGL to a predetermined level, it is possible to provide a device which does not generate abnormal light emission while maintaining the maximum driving voltage or lifespan of the device.

In another exemplary embodiment of the present invention, a white organic light emitting device 200 includes the first electrode 102, the second electrode 104, the first light emitting unit 110 and the second light emitting unit 120 provided between the first and second electrodes 102 and 104, and a third light emitting unit 130.

In theory, a blue emitting layer formed of a fluorescent material has a quantum efficiency of about 25% as compared with an emitting layer formed of a phosphorescent material. Thus, the blue emitting layer formed of a fluorescent material has a problem of insufficient luminance as compared with other phosphorescent materials. Therefore, in order to increase lifespan by improving emission efficiency of the blue emitting layer, the third light emitting unit 130 including a third emitting layer (EML) 134 is further included in another exemplary embodiment of the present invention.

The first EML 114 of the first light emitting unit 110 is formed of a blue emitting layer. The peak wavelength of a light emitting area of the blue emitting layer may within a range of 440 nm to 480 nm.

The second EML 124 of the second light emitting unit 120 is formed of a yellow-green emitting layer. The peak wavelength of a light emitting area of the yellow-green emitting layer may within a range of 510 nm to 580 nm.

The third EML 134 of the third light emitting unit 110→130 is formed of a blue emitting layer. The peak wavelength of a light emitting area of the blue emitting layer may within a range of 440 nm to 480 nm.

The first light emitting unit 110 and the second light emitting unit 120 are components identical or corresponding to those of the above-described exemplary embodiment, and, thus, descriptions thereof will be omitted.

The third light emitting unit 130 may include a third electron transporting layer (ETL) 136, a third emitting layer (EML) 134, and a third hole transporting layer (HTL) 132 under the second electrode 104. Although not illustrated in the drawing, an electron injecting layer (EIL) may be further included on the third ETL 136 in the third light emitting unit 130. Further, the third light emitting unit 130 may further include a hole injecting layer (HIL).

The third HTL 132 may be formed of TPD (N,N'-diphenyl-N,N'-bis(3-methylphenyl)-1,1'-bi-phenyl-4,4'-di amine) or NPB (N,N'-di(naphthalen-1-yl)-N,N'-di(phenyl)-benzidine), but is not necessarily limited thereto.

The third HTL 132 may be formed by applying two or more layers or two or more materials.

The third ETL 136 may be formed of oxadiazole, triazole, phenanthroline, benzoxazole, benzthiazole, or the like, but is not necessarily limited thereto.

The third ETL 136 may be formed by applying two or more layers or two or more materials.

A second charge generation layer (CGL) 150 is formed between the second light emitting unit 120 and the third light emitting unit 130. The second CGL 150 adjusts a balance of charges between the second and third light emitting units 120 and 130. The second CGL 150 may include an N-type charge generation layer (N-CGL) and a P-type charge generation layer (P-CGL).

The N-CGL is configured to inject electrons to the second light emitting unit 120, and the P-CGL is configured to inject holes into the third light emitting unit 130.

If a metal doping the N-CGL included in the first CGL 140 and the second CGL 150 has a too high or low work function, a gap state between the N-CGL and the metal is not properly formed. Thus, it becomes difficult to transfer electrons. Therefore, a doping metal having a too high or low work function may cause an increase in a driving voltage or a decrease in lifespan.

Therefore, in consideration of abnormal light emission, a driving voltage, or a lifespan, a work function of the metal included in the charge generation layer may be set in the range of 2.2 to 4.1 eV. That is, the metal doping the N-CGL included in the first CGL 140 and the second CGL 150 may be at least one of alkali metals or alkali earth metals having a work function in the range of 2.2 to 4.1 eV. For example, the N-CGL may be formed of an organic layer doped with an alkali metal such as lithium (Li), sodium (Na), potassium (K), or cesium (Cs), or an alkali earth metal such as magnesium (Mg), strontium (Sr), barium (Ba), or radium (Ra), or a combination thereof. However, it is not necessarily limited thereto.

The P-CGL may be formed of an organic layer including a P-type dopant or an inorganic material or a combination thereof, but is not necessarily limited thereto.

The P-CGL may be formed of an organic layer including a P-type dopant or an inorganic material or a combination thereof, but is not necessarily limited thereto.

The inorganic dopant in the P-CGL may include one of, for example, magnesium fluoride ($MgF_2$), magnesium chloride ($MgCl_2$), and zinc fluoride ($ZnF_2$), but is not necessarily limited thereto.

The P-CGL and the N-CGL may be formed of the same material, but are not necessarily limited thereto. If the P-CGL and the N-CGL may be formed of the same material, an interface between the P-CGL and the N-CGL can be removed, and, thus, a lifespan of the device can be increased.

Further, the P-CGL and the N-CGL may be formed of different materials, but are not necessarily limited thereto. If the P-CGL and the N-CGL may be formed of different materials, there may be an advantage in transmission efficiency in transferring or shifting a carrier for an electron or a hole.

The first CGL 140 may be formed of the same material as the N-CGL and the P-CGL of the second CGL 150, but is not necessarily limited thereto.

The second CGL 150 may be formed of the same material as the first CGL 140, but is not necessarily limited thereto.

Further, the first CGL 140 may be formed of a single layer. Furthermore, the second CGL 150 may be formed of a single layer.

The white organic light emitting device according to another exemplary embodiment of the present invention is a bottom-emission type, but it can be applied to a top-emission type or dual-emission type.

Further, in an organic light emitting display device including the organic light emitting device according to another exemplary embodiment of the present invention, gate lines and data lines configured to define respective pixel areas cross each other on a substrate. A power supply line is extended in parallel with any one of them, and a switching thin film transistor connected with the gate line and the data line in each pixel area. Also a driving thin film transistor is connected with the switching thin film transistor in each pixel area. The driving thin film transistor is connected with the first electrode 102.

In the white organic light emitting device according to another exemplary embodiment of the present invention, a content of an alkali metal or alkali earth metal in the first CGL 140 and the second CGL 150 is adjusted.

A content of an alkali metal or alkali earth metal in the N-CGLs of the first CGL 140 and the second CGL 150 is not randomly set, but it needs to be set in consideration of a structure or a characteristic of the device. Further, since the N-CGLs are two layers, adjusting the content requires particular attention. That is, the content of an alkali metal or alkali earth metal needs to be adjusted so as to be capable of adjusting abnormal light emission without affecting performance of the device. As described above, if the content of an alkali metal or alkali earth metal in the N-CGLs is lower than a predetermined level, normal white light cannot be emitted and a driving voltage may be increased.

If the content of an alkali metal or alkali earth metal in the N-CGLs is equal to or higher than the predetermined level, a driving voltage may be increased and abnormal light emission may occur when the organic light emitting device is manufactured. Such abnormal light emission causes a leakage in which adjacent pixels are simultaneously turned on when the white organic light emitting device is turned on. Further, the N-CGL has a higher conductivity than the P-CGL, and, thus, a leakage more often occurs in the N-CGL.

Since abnormal light emission occurs and a driving voltage is increased according to a content of a metal included in the two N-CGLs, the inventors of the present invention conducted experiments for evaluating abnormal light emission and measuring a driving voltage and lifespan depending on a metal content in order to adjust the metal content. Results of the experiments are as illustrated in FIG. 4 and listed in Table 2.

Figure 3:
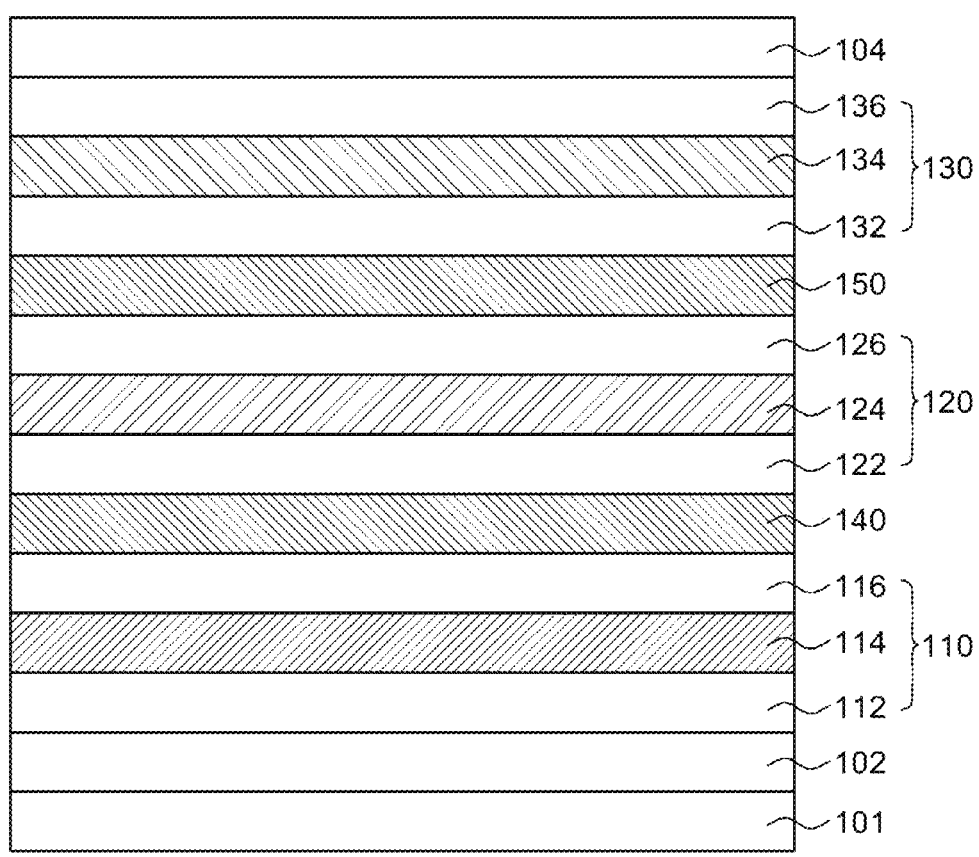
FIG. 3 is a schematic cross-sectional view illustrating a white organic light emitting device according to another exemplary embodiment of the present invention.
Figure 4:
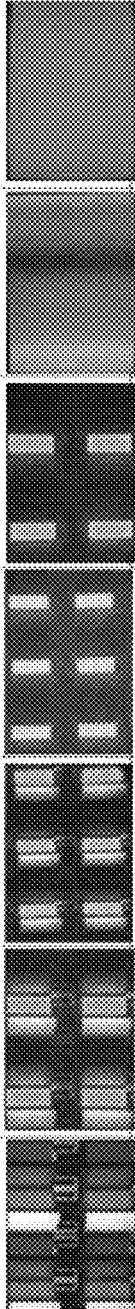
FIG. 4 is a diagram illustrating an experimental result of the white organic light emitting device according to another exemplary embodiment of the present invention.

As illustrated in FIG. 4, there were five panels for experiment, and abnormal light emission of the panels was evaluated. The organic light emitting device illustrated in FIG. 3 was applied to the five panels. Further, abnormal emission of red, green, blue, and white lights was measured.

In this experiment, abnormal light emission was measured with the N-CGL having thickness of 200 Å, but the thickness is not limited thereto.

A driving voltage is affected by the thickness of the N-CGL and the content of a metal in the N-CGL. Therefore, if the thickness of the N-CGL is within a range of 100 Å to 300 Å, the device may obtain a desired characteristic such as a reduced driving voltage or an increased lifespan. That is, the thickness of the N-CGL may be within the range of 100 Å to 300 Å in order to reduce a driving voltage and increase lifespan. Further, if the thickness of the P-CGL is within a range of 50 Å to 200 Å, the device may obtain a desired characteristic such as a reduced driving voltage or increased lifespan. That is, the thickness of the P-CGL may be within the range of 50 Å to 200 Å in order to reduce a driving voltage and increase a lifespan.

In FIG. 4, a content of an alkali metal or alkali earth metal in the N-CGL of the first CGL 140 is referred to as "metal content 1". Further, a content of an alkali metal or alkali earth metal in the N-CGL of the second CGL 150 is referred to as "metal content 2".

In a panel 7 as illustrated in FIG. 4, a content of an alkali metal or alkali earth metal in the N-CGL of the first CGL 140 is 1.0% and a content of an alkali metal or alkali earth metal in the N-CGL of the second CGL 150 is 1.0%. Thus, a content of an alkali metal or alkali earth metal included in the first CGL 140 and the second CGL 150 is 2.0%.

In a panel 8, a content of an alkali metal or alkali earth metal in the N-CGL of the first CGL 140 is 0.7% and a content of an alkali metal or alkali earth metal in the N-CGL of the second CGL 150 is 0.7%. Thus, a content of an alkali metal or alkali earth metal in the first CGL 140 and the second CGL 150 is 1.4%.

In a panel 9, a content of an alkali metal or alkali earth metal in the N-CGL of the first CGL 140 is 0.5% and a content of an alkali metal or alkali earth metal in the N-CGL of the second CGL 150 is 0.5%. Thus, a content of an alkali metal or alkali earth metal in the first CGL 140 and the second CGL 150 is 1.0%.

In a panel 10, a content of an alkali metal or alkali earth metal in the N-CGL of the first CGL 140 is 0.4% and a content of an alkali metal or alkali earth metal in the N-CGL of the second CGL 150 is 0.4%. Thus, a content of an alkali metal or alkali earth metal in the first CGL 140 and the second CGL 150 is 0.8%.

In a panel 11, a content of an alkali metal or alkali earth metal in the N-CGL of the first CGL 140 is 0.3% and a content of an alkali metal or alkali earth metal in the N-CGL of the second CGL 150 is 0.3%. Thus, a content of an alkali metal or alkali earth metal in the first CGL 140 and the second CGL 150 is 0.6%.

According to the results of measurement from the panel 7 to panel 11, it can be seen that in the panel 10 to panel 11 in which the content of an alkali metal or alkali earth metal in the N-CGLs of the first CGL 140 and the second CGL 150 is 0.8% or less, abnormal light emission does not occur.

Further, according to the results of measurement from front surfaces of the panels, it can be seen that in the panel 10 in which the content of an alkali metal or alkali earth metal in the N-CGLs is 0.8%, abnormal light emission does not occur as compared with the panel 7 with the content of 2.0%.

Therefore, it can be seen that if the content of a metal in the N-CGLs of the first CGL 140 and the second CGL 150 is adjusted to 0.8% or less of the total volume of the N-CGLs, abnormal light emission does not occur. That is, it can be seen that if the content of a metal in the N-CGLs is set in the range of 0.6% to 0.8% of the total volume of N-CGLs, abnormal light emission does not occur.

The results of measurement on a driving voltage and a lifespan from the panel 7 to panel 11 are as listed in Table 2 below. A driving voltage was measured at a current density of 10 mA/cm$^2$.

TABLE 2

| Classification | Panel 7 | Panel 8 | Panel 9 | Panel 10 | Panel 11 |
|---|---|---|---|---|---|
| Voltage (10 mA/cm$^2$) | 14.2 | 11.7 | 11.6 | 10.9 | 15.5 |
| Lifespan (%) | 79 | 84 | 100 | 100 | 98 |

As listed in Table 2, it can be seen that as a content of a metal in the N-CGLs increases, a driving voltage increases.

Further, it can be seen that in the panel 11 having a metal content of 0.6% in the N-CGLs, a driving voltage is high. Therefore, it can be seen that a driving voltage cannot be lowered by reducing a content of a metal in the N-CGLs. If a metal content is set to 0.6%, abnormal light emission does not occur. Therefore, it can also be applied to a device.

Further, in terms of lifespan, it can be seen that range of lifespan of the panel 10 and the panel 11 having a metal content of 0.8% or less in the N-CGLs is from 100% to 98%. Meanwhile, it can be seen that the panel 7 having a metal content of 2.0% and the panel 8 having a metal content of 1.4% have a shorter lifespan.

Therefore, since it is possible to set a content of a metal included in the N-CGLs depending on a desired characteristic of a device, it is possible to set the content of a metal in the N-CGLs to 0.6% to 0.8% in consideration of improvement of abnormal light emission and characteristics such as a driving voltage or a lifespan.

According to the above-described experimental results, it can be seen that if a metal content in two N-CGLs of an organic light emitting device including three light emitting units is adjust to 0.8% or less of the total volume of the N-CGLs, it is possible to prevent abnormal light emission of the device. There is an advantage in a driving voltage or a lifespan of the device.

That is, it can be seen that when a content of a metal in the N-CGLs is within the range of 0.6% to 0.8% of the total volume of the N-CGLs, it is possible to prevent abnormal light emission of the device. There is an advantage in a driving voltage or a lifespan of the device.

As described above, it can be seen that if the total volume of the metal in the first CGL and the second CGL is within the range of 0.6% to 0.8%, abnormal light emission does not occur as compared with a case where the total volume of the metal in the first CGL and the second CGL is 1.0% or more. Further, it can be seen that if the total volume of the metal in the first CGL and the second CGL is within the range of 0.6% to 0.8%, a driving voltage is reduced as compared with a case where the total volume of the metal in the first CGL and the second CGL is 1.0% or more. Furthermore, it can be seen that if the total volume of the metal in the first CGL and the second CGL is within the range of 0.6% to 0.8%, lifespan is increased as compared with a case where the total volume of the metal in the first CGL and the second CGL is 1.0% or more. Therefore, by adjusting a content of a metal in the N-CGLs to a predetermined level, it is possible to provide a device which does not generate abnormal light emission while maintaining the maximum driving voltage or lifespan of the device.

As described above, in the case of adjusting a metal content in a charge generation layer, when a metal content is set to be high, it becomes easy to adjust the content and there may be an advantage in a driving voltage. However, if the metal content is set to be higher than a predetermined level, abnormal light emission occurs. If the metal content is set to be lower than the predetermined level, a driving voltage may be increased or lifespan may be decreased. Therefore, in the present invention, there is provided a device that does not generate abnormal light emission while maintaining the maximum driving voltage or lifespan in consideration of improvement of abnormal light emission and characteristics such as a driving voltage or a lifespan.

Although the exemplary embodiments of the present invention have been described in detail with reference to the accompanying drawings, the present invention is not limited thereto and may be embodied in many different forms without departing from the technical concept of the present invention. Therefore, the exemplary embodiments of the present invention are provided for illustrative purposes only but not intended to limit the technical concept of the present invention. The scope of the technical concept of the present invention is not limited thereto. Therefore, it should be understood that the above-described exemplary embodiments are illustrative in all aspects and do not limit the present invention. The protective scope of the present invention should be construed based on the following claims, and all the technical concepts in the equivalent scope thereof should be construed as falling within the scope of the present invention.

What is claimed is:

1. A white organic light emitting device comprising:
    a first light emitting unit between a first electrode and a second electrode;
    a second light emitting unit on the first light emitting unit; and
    a first charge generation layer between the first light emitting unit and the second light emitting unit;
    a third light emitting unit on the second light emitting unit; and
    a second charge generation layer between the second light emitting unit and the third light emitting unit,
    wherein a volume of a metal in the first charge generation layer is within a range of 1.0% or less of the total volume of the first charge generation layer in consideration of abnormal light emission, a driving voltage, or a lifespan, and
    wherein the first charge generation layer includes a P-type charge generation layer and a N-type charge generation layer, and
    wherein the total volume of the metal in the first charge generation layer and the second charge generation layer is 0.8% or less of the total volume of the first charge generation layer and the second charge generation layer in consideration of the abnormal light emission, the driving voltage, or the lifespan.

2. The white organic light emitting device according to claim 1, wherein the volume of the metal is within a range of 0.3% to 1.0% of the total volume of the first charge generation layer.

3. The white organic light emitting device according to claim 2, wherein in the white organic light emitting device in which the volume of the metal in the first charge generation layer is within a range of 0.3% to 1.0% of the total volume of the first charge generation layer, the abnormal light emission does not occur as compared with the white organic light emitting device in which the volume of the metal in the first charge generation layer is more than 1.0% of the total volume of the first charge generation layer.

4. The white organic light emitting device according to claim 2, wherein in the white organic light emitting device in which the volume of the metal in the first charge generation layer is within a range of 0.3% to 1.0% of the total volume of the first charge generation layer, the driving voltage is reduced as compared with the white organic light emitting device in which the volume of the metal in the first charge generation layer is more than 1.0% of the total volume of the first charge generation layer.

5. The white organic light emitting device according to claim 2, wherein in the white organic light emitting device in which the volume of the metal in the first charge generation layer is within a range of 0.3% to 1.0% of the total volume of the first charge generation layer, the lifespan is increased as compared with the white organic light emitting device in which the volume of the metal in the first charge generation layer is more than 1.0% of the total volume of the first charge generation layer.

6. The white organic light emitting device according to claim 1, wherein the metal is in the N-type charge generation layer of the first charge generation layer.

7. The white organic light emitting device according to claim 6, wherein the metal is one of lithium (Li), sodium (Na), potassium (K), cesium (Cs), magnesium (Mg), strontium (Sr), barium (B a), and radium (Ra), or a combination thereof.

8. The white organic light emitting device according to claim 6, wherein the metal has a work function in the range of 2.2 to 4.1 eV.

9. The white organic light emitting device according to claim 6, wherein the N-type charge generation layer has a thickness of 100 Å to 300 Å so as to reduce the driving voltage and increase the lifespan.

10. The white organic light emitting device according to claim 6, wherein the P-type charge generation layer of the first charge generation layer has a thickness of 50 Å to 200 Å so as to reduce the driving voltage and increase the lifespan.

11. The white organic light emitting device according to claim 1, wherein the volume of the metal is within a range of 0.6% to 0.8% of the total volume of the first charge generation layer and second charge generation layer.

12. The white organic light emitting device according to claim 11, wherein in the white organic light emitting device in which the total volume of the metal in the first charge generation layer and the second charge generation layer is within a range of 0.6% to 0.8%, the abnormal light emission does not occur as compared with the white organic light charge generation layer and the second charge generation layer is 1.0% or more.

13. The white organic light emitting device according to claim 11, wherein in the white organic light emitting device in which the total volume of the metal in the first charge generation layer and the second charge generation layer is within a range of 0.6% to 0.8%, the driving voltage is reduced as compared with the white organic light emitting device in which the total volume of the metal in the first charge generation layer and the second charge generation layer is 1.0% or more.

14. The white organic light emitting device according to claim 11, wherein in the white organic light emitting device in which the total volume of the metal in the first charge generation layer and the second charge generation layer is within a range of 0.6% to 0.8%, the lifespan is increased as compared with the white organic light emitting device in which the total volume of the metal in the first charge generation layer and the second charge generation layer is 1.0% or more.

15. The white organic light emitting device according to claim 1, wherein the second charge generation layer includes the P-type charge generation layer and the N-type charge generation layer, and the metal is in the N-type charge generation layer.

16. The white organic light emitting device according to claim 15, wherein the metal is one of lithium (Li), sodium (Na), potassium (K), cesium (Cs), magnesium (Mg), strontium (Sr), barium (B a), and radium (Ra), or a combination thereof.

17. The white organic light emitting device according to claim 15, wherein the metal has a work function in the range of 2.2 to 4.1 eV.

18. The white organic light emitting device according to claim 15, wherein the N-type charge generation layer has a thickness of 100 Å to 300 Å so as to reduce the driving voltage and increase the lifespan.

19. The white organic light emitting device according to claim 15, wherein the P-type charge generation layer has a thickness of 50 Å to 200 Å so as to reduce the driving voltage and increase the lifespan.

20. A white organic light emitting device comprising:
a first light emitting unit between a first electrode and a second electrode;
a second light emitting unit on the first light emitting unit;
a first charge generation layer between the first light emitting unit and the second light emitting unit;
a third light emitting unit on the second light emitting unit; and
a second charge generation layer between the second light emitting unit and the third light emitting unit,
wherein a work function of a metal in the charge generation layer is set to be 2.2 to 4.1 eV in consideration layer of abnormal light emission, a driving voltage, or a lifespan, and
wherein the total volume of the metal in the first charge generation layer and the second charge generation layer is 0.8% or less of the total volume of the first charge generation layer and the second charge generation layer in consideration of the abnormal light emission, the driving voltage, or the lifespan.

21. The white organic light emitting device according to claim 20, wherein the volume of the metal is 1.0% or less of the total volume of the first charge generation layer.

22. The white organic light emitting device according to claim 21, wherein the volume of the metal is within a range of 0.3% to 1.0% of the total volume of the first charge generation layer.

23. The white organic light emitting device according to claim 20, wherein the first charge generation layer includes an N-type charge generation layer, and the metal is included in the N-type charge generation layer.

24. The white organic light emitting device according to claim 20, wherein the volume of the metal is within a range of 0.6% to 0.8% of the total volume of the first charge generation layer and second charge generation layer.

25. The white organic light emitting device according to claim 20, wherein the first charge generation layer and the second charge generation layer include N-type charge generation layers, and the metal is in the N-type charge generation layers.

* * * * *